(12) United States Patent
Sheffield

(10) Patent No.: US 7,599,194 B2
(45) Date of Patent: Oct. 6, 2009

(54) METHODS AND APPARATUS FOR A REDUNDANT BOARD ASSEMBLY

(75) Inventor: Gregory L. Sheffield, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 526 days.

(21) Appl. No.: 11/317,348

(22) Filed: Dec. 22, 2005

(65) Prior Publication Data

US 2007/0147011 A1 Jun. 28, 2007

(51) Int. Cl.
*H05K 7/02* (2006.01)

(52) U.S. Cl. .................. 361/788; 361/796; 361/752; 710/301

(58) Field of Classification Search ........... 361/788, 361/796, 752; 710/301, 305
See application file for complete search history.

(56) References Cited

U.S. PATENT DOCUMENTS

| | | | | | |
|---|---|---|---|---|---|
| 5,576,935 | A | * | 11/1996 | Freer et al. | 361/785 |
| 5,648,891 | A | * | 7/1997 | Gierut | 361/788 |
| 6,608,755 | B2 | * | 8/2003 | Baldwin et al. | 361/729 |
| 6,801,769 | B1 | | 10/2004 | Royalty | |
| 7,254,039 | B2 | * | 8/2007 | Sandy et al. | 361/788 |
| 7,281,076 | B2 | * | 10/2007 | Yates et al. | 710/305 |
| 2004/0073834 | A1 | * | 4/2004 | Kermaani et al. | 714/13 |
| 2004/0221084 | A1 | * | 11/2004 | Yates et al. | 710/305 |
| 2005/0071689 | A1 | * | 3/2005 | Coward et al. | 713/300 |

* cited by examiner

*Primary Examiner*—Dameon E Levi
(74) *Attorney, Agent, or Firm*—Yee & Associates, P.C.; Dennis R. Plank

(57) ABSTRACT

A redundant pair of interconnected board sub-assemblies have substantially the same dimensions and level of functionality. A module interconnect card is configured to mechanically and electronically connect to the first and second board sub-assemblies. Each sub-assembly is configured (e.g., via a properly configured microcontroller) to compensate for a loss of functionality in the other sub-assembly. Each subassembly preferably includes a re-usable adapter card that interfaces with a first card such that components requiring a lower certification level—e.g., commercial off-the-shelf (COTS) components or the like—may be isolated on the first card, wherein the adapter card includes high certification-level parts and communicates with the first card. The two cards are electronically and mechanically coupled to form the finished board assembly. The interface card may be re-used in a variety of current or future cabinet specifications, including, for example, cabinets manufactured in accordance with the Compact PCI (cPCI) 3U and 6U specifications.

18 Claims, 4 Drawing Sheets

METHODS AND APPARATUS FOR A REDUNDANT BOARD ASSEMBLY

TECHNICAL FIELD

The present invention generally relates to peripheral interface boards and, more particularly, to the use of redundancy in connection with re-usable adapter cards and assemblies.

BACKGROUND

In government and commercial systems, it is desirable for interface boards and other such components to be reliable and exhibit a high Mean Time Between Failure (MTBF). Stated another way, it is desirable for interface boards to have a "high availability"—i.e., to be functional and operable within their intended applications.

Furthermore, interface boards must typically conform to one or more standards and/or specifications. These guidelines not only specify the size and shape (i.e., "form factor") of the board for a particular cabinet or other enclosure, but also set forth power requirements, communication protocols, safety standards, and the like. In this regard, it is often the case that boards developed in accordance with one standard cannot later be used in applications conforming to subsequent standards. Conversely, a board developed according to a later standard may not be backward-compatible with prior cabinets and systems. The need to constantly update boards in order to adhere to changing standards gives rise to significant costs.

Furthermore, the components included on such boards (and/or the software incorporated into those components) may require extensive testing and/or must conform to strict design rules in order to meet applicable safety standards. As a result, original equipment manufacturers (OEMs), integrators, and resellers have increasingly turned to designing and building cost-effective solutions using commercial off-the-shelf (COTS) components. Such COTS components (or collections of components) are typically less expensive than equivalent custom-built components; however, since COTS components are typically integrated with non-COTS components on the same board, the cost-savings associated with using COTS components is significantly reduced because the entire system (i.e., the board itself) must still be tested to the higher level of certification.

Accordingly, it is desirable to develop systems and methods for interface cards that exhibit a high availability and high MTBF while allowing board components to be backward-compatible with legacy systems.

BRIEF SUMMARY

The invention may be embodied in one form by a redundant pair of interconnected board sub-assemblies that have substantially the same dimensions and level of functionality. A module interconnect card is configured to mechanically and electronically connect to the first and second board sub-assemblies. Each sub-assembly is configured (e.g., via a properly configured microcontroller) to compensate for a loss of functionality in the other sub-assembly. For example, in one embodiment of the present invention, two 3U boards are interconnected for use in a 6U-sized cabinet, thereby increasing the availability and MTBF of the complete assembly.

In accordance with one embodiment of the present invention, each board subassembly includes a first card and a re-usable adapter card that interfaces with the first card such that components requiring a lower certification level—e.g., commercial off-the-shelf (COTS) components—may be isolated on the first card, and higher certification-level parts are isolated on the adapter card, which communicates with the first card. The two cards are electronically and mechanically coupled to form the finished board assembly. The interface card may be re-used in a variety of current or future cabinet specifications, including, for example, cabinets manufactured in accordance with the Compact PCI (cPCI) 3U and 6U specifications.

BRIEF DESCRIPTION OF THE DRAWINGS

The present invention will hereinafter be described in conjunction with the following drawing figures, wherein like numerals denote like elements.

DETAILED DESCRIPTION

Figure 1:
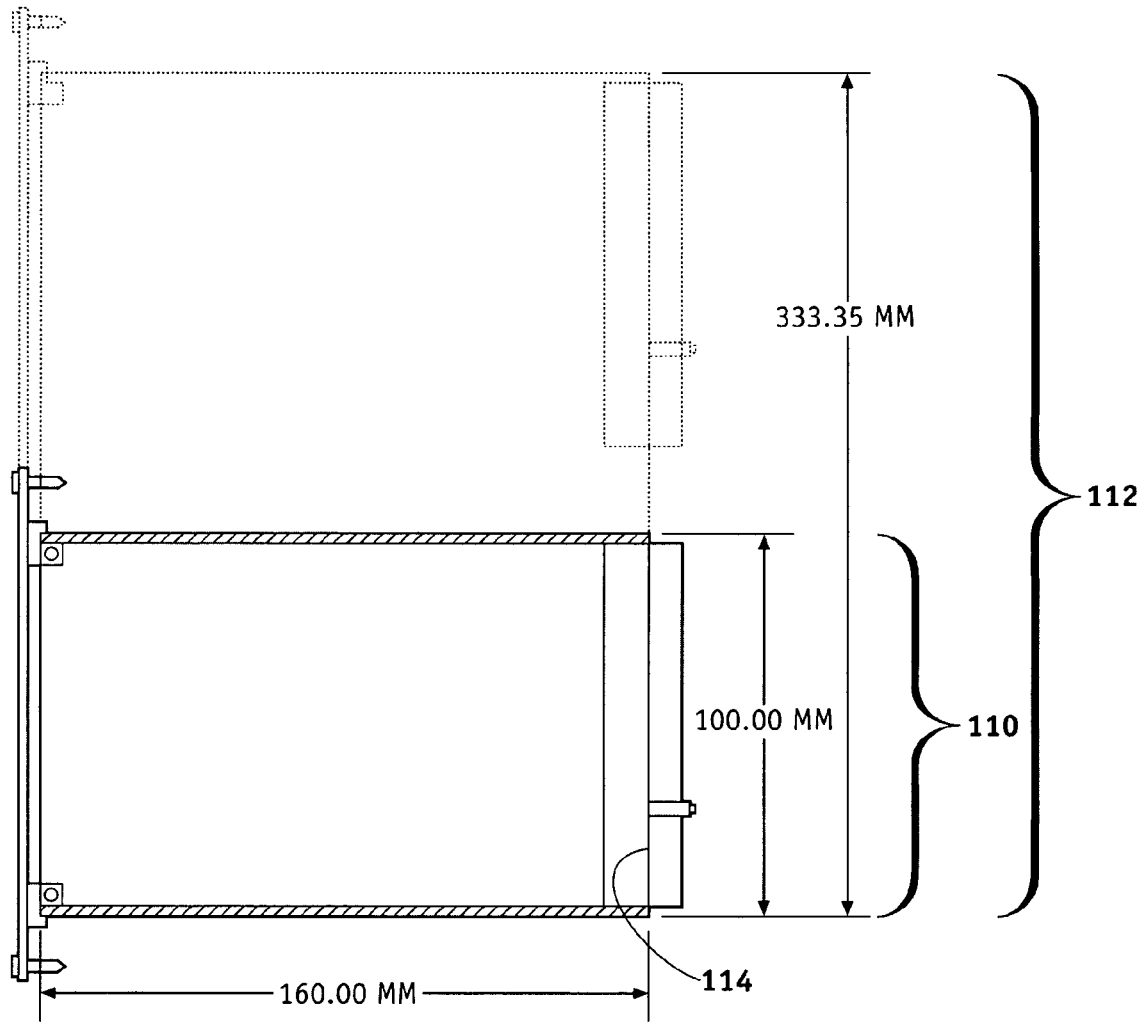
FIG. 1 is a side view showing dimensional differences between cPCI 6U and 3U modules.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that the present invention may be practiced in conjunction with any number of data transmission protocols and that the system described herein is merely one exemplary application for the invention.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

In general, the present invention relates to a re-usable adapter card that interfaces with another card such that components requiring a lower certification level—e.g., commercial off-the-shelf (COTS) components or the like—are isolated on the first card, and components requiring a higher certification level are attached to the adapter card. The two cards are electronically and mechanically coupled to form the finished board assembly whose size is selected such that it may fit within a variety of current or future cabinet specifications.

One such specification is the Compact Peripheral Component Interface (cPCI) specification, which is adapted from the Peripheral Component Interface (PCI) standard used in industrial computer application, but uses a smaller, VME (VersaModule-Eurocard) format. Detailed information regarding this specification can be found, for example, in PICMG 2.0 Rev 3.0 CompactPCI Core Specification and PICMG 2.1-2.20, published by the PCI Industrial Computer Manufacturer's Group (PICMG). The cPCI products allow original equipment manufacturers (OEMs), integrators, and resellers to design and build cost-effective solutions using commercial, off-the-shelf (COTS) components.

There are two card sizes or "form factors" supported by cPCI, as shown in FIG. 1: A "3U" card that is 100 mm×160 mm and has a single 220-pin connector, and a "6U" card that is 233 mm×160 mm and can support up to three additional connectors. In each case, the card-side connector is male (right-angle), and the backplane side (114) is female (straight). The boards are designed from front-loading and removal. Boards are mounted vertically to enhancing heat transfer. In general, cPCI supports a 32- or 64-bit synchronous data bus, a 32-bit address bus, and a 133 or 266 MBytes/s data transfer rate.

Figure 2:
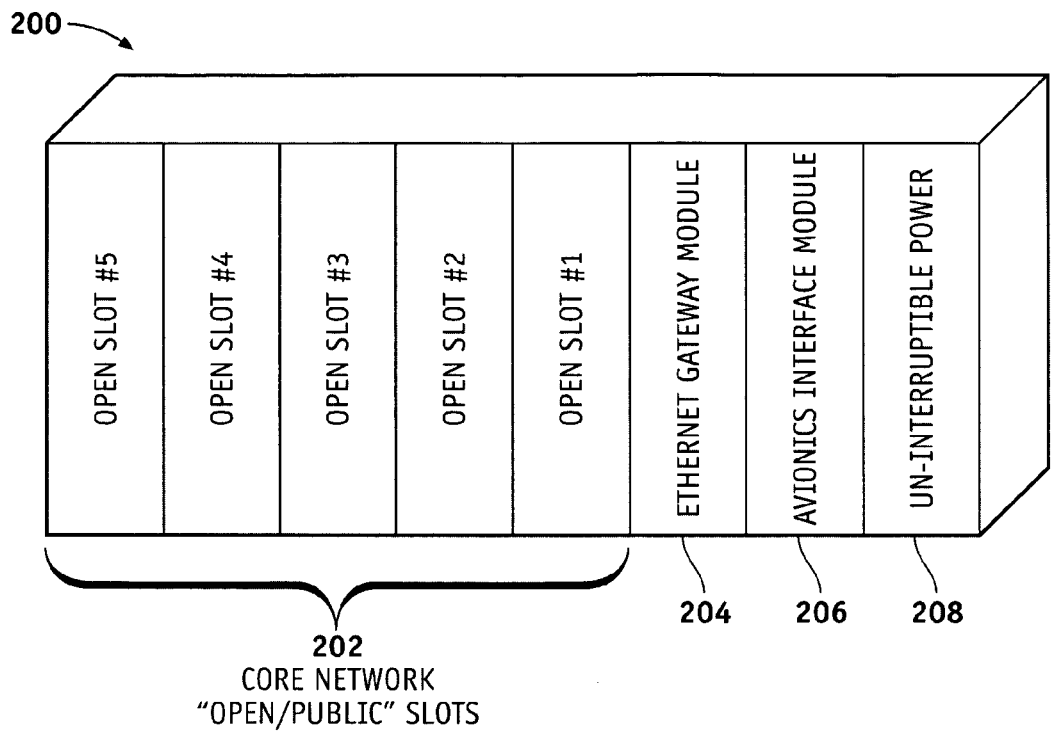
FIG. 2 is a schematic overview of a core network cabinet showing allocation of slots.

A system in accordance with the cPCI specification supports up to eight-slot backplanes. FIG. 2 shows a exemplary core network 8-slot cabinet 200 of the type having 6U-based dimensions. In accordance with this configuration, there are five open slots 202 (#1-#5), an Ethernet module 204, an avionics interface module (AIM) 206, and an un-interruptible power supply 208. The five open slots 202 are generally filled by five corresponding 6U boards. Low-profile boards (e.g., 3U boards) are generally not configured to fit within these open slots, reducing the utility of the cabinet as new board specifications are developed.

Figure 3:
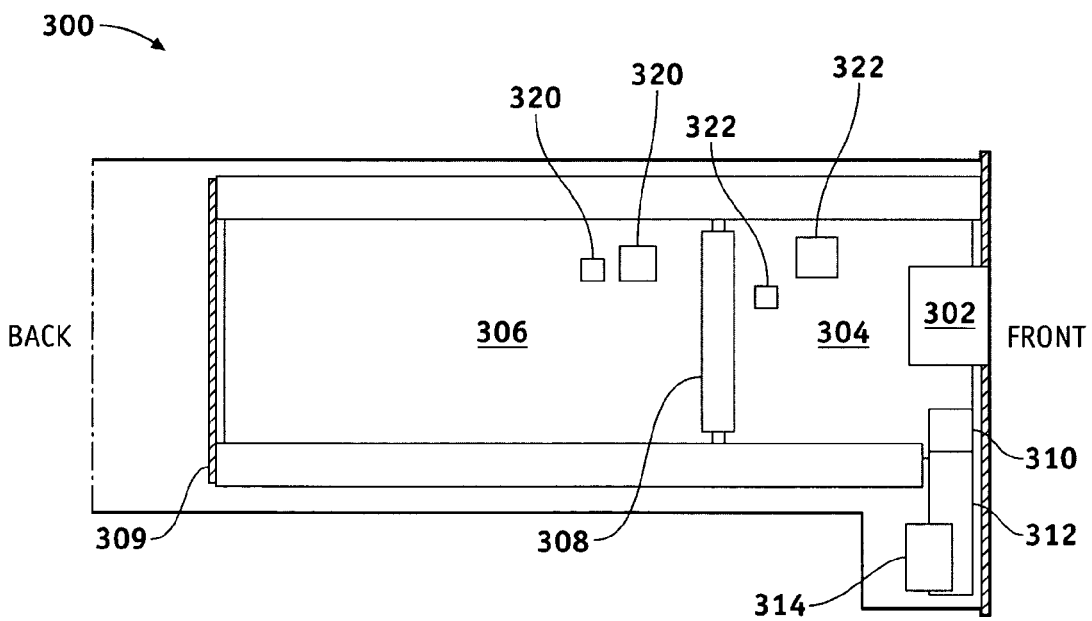
FIG. 3 an overview of a module in accordance with one embodiment of the present invention.

Referring now to FIG. 3, an assembly 300 in accordance with one embodiment of the present invention generally includes a card 306, an adapter card 304 electrically and mechanically connected to card 306 via connector 308 at one end (i.e., the right end in FIG. 3), an optional external connector 302, and an extender card 312 coupled to functional blocks 310 and 314, described in further detail below. Board 304 includes one or more electronic components 322, and board 306 similarly includes one or more electronic components 320. One end (309) of card 306 is configured to interface with a backplane of a cabinet (not shown). Adapter card 304 includes one or more (preferably two) expansion connections 412 and 414 to support communication between redundant boards within the same cabinet, as discussed in further detail below.

Adapter card 304 communicates with components 320 on card 306 as well as any external interfaces, including, for example, any backplane to which side 309 is ultimately connected. In accordance with one aspect of the present invention, components 320 on board 306 and/or the entire board 306 conform to a certification level that is lower than that of adapter board 304 (and/or components 322). For example, board 306 may be populated entirely by COTS components, while board 304 is populated by components that conform to a higher certification level.

In this regard, the term "certification" as used herein refers to any set of guidelines or standards, developed by a certification authority, to which a component or system must comply in order to be considered as conforming to that certification designation. The terms "higher" or "lower" as used with respect to a level of certification refers to the relative difficulty in achieving that certification designation. A certification level may be considered more difficult to obtain, for example, if it includes additional criterion, more restrictive criterion, more stringent testing, or a combination thereof.

The DO-178 requirements promulgated by the Radio Technical Commission for Avionics (RTCA), for example, provide for a number of different aircraft-related certification levels for software/hardware systems. The ED-35 standard developed by the European organization for Civil Aviation Equipment (EUROCAE) is another such standard. In the DO-178 standard, five different levels are defined depending upon what would occur in the event of failure, e.g.: Level E (the lowest level, where failure would have no effect on an aircraft), Level D (causing or contributing to a minor failure condition), Level C (causing or contributing to a major failure condition), Level B (causing or contributing to hazardous/severe major failure condition), and Level A (the highest level, where failure of the component or software would result in a catastrophic failure condition).

Referring again to FIG. 3, connector 308 (which may be physically integrated into one or both of cards 304 and 306) allows adapter card 304 to be removeably attached to card 306. In this regard, connector 308 includes electronic contacts and signal routing hardware suitable to provide electrical connectivity as well as mechanical connectivity. The dimensions of first board 306 and second board 304 (as well as connector 308) may be selected such that the combined length and height of assembly 300 conforms with any particular standard (e.g., the cPCI 3U standard).

Extender card 312 may include or interface with circuitry within functional blocks 310 and 314. These functional blocks relate to inter-cabinet communications and external communications described further below in conjunction with FIG. 5, wherein block 310 corresponds to block 534, and block 314 is any interface capable of facilitating communication between card 304 and various external and/or internal components (e.g., legacy connections required for backward-compatibility).

Figure 4:
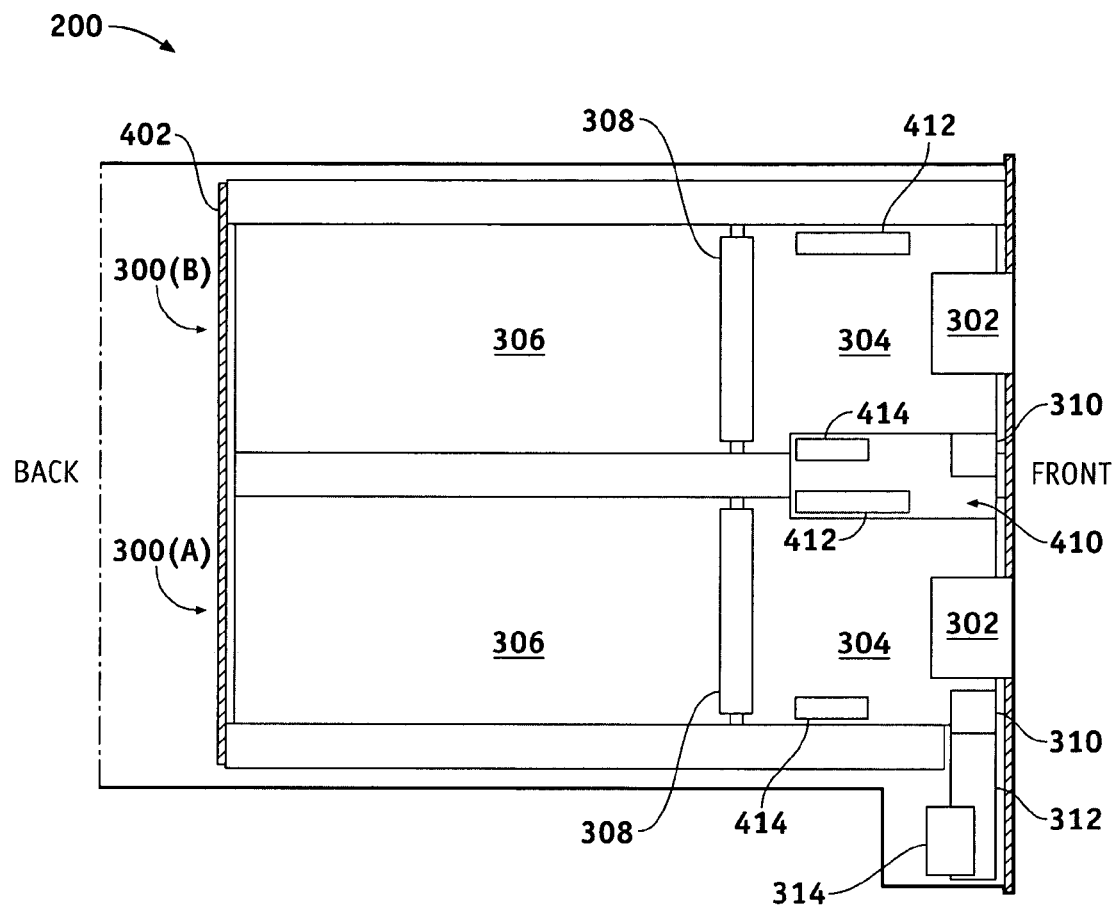
FIG. 4 is an overview of two modules in accordance with FIG. 3 inserted into a 6U cabinet.

In accordance with another aspect of the present invention, two communicatively-coupled adapter cards 304 are configured to fit within prior cabinet designs originally configured to fit a single card. FIG. 4, for example, shows two board sub-assemblies 300 inserted into a 6U cabinet of the type illustrated in FIG. 2. The two sub-assemblies 300(*a*) and 300(*b*) are connected via a module interconnect card 410. In the illustrated embodiment, the bottom expansion connection 414 of sub-assembly 300(*b*) and the top expansion connection 412 of sub-assembly 300(*a*) are both connected to module interconnect board 410. Board 410 preferably provides structural as well as electrical connectivity between the two adapter cards 304, such that the entire collection of components (boards 306, 304, and 410) may be treated as a single board for the purposes of interfacing with cabinet 402. In this way, the 6U cabinet can be used to house pairs of 3U boards configured in a redundant fashion.

As mentioned previously, the redundant pair of interconnected board sub-assemblies 300(*a*) and 300(*b*) have substantially the same dimensions and level of functionality. Module interconnect card 410 is configured to mechanically and electronically connect to the first and second board sub-assemblies. Each sub-assembly is configured (e.g., via a properly configured microcontroller) to compensate for a loss of functionality in the other sub-assembly. That is, for example, if board 300(*a*) loses all or some of its functionality, board 300(*b*) is aware of this loss of functionality and steps in to provide the lost functionality. In this way, the effective availability of the system is increased, as is its MTBF.

Figure 5:
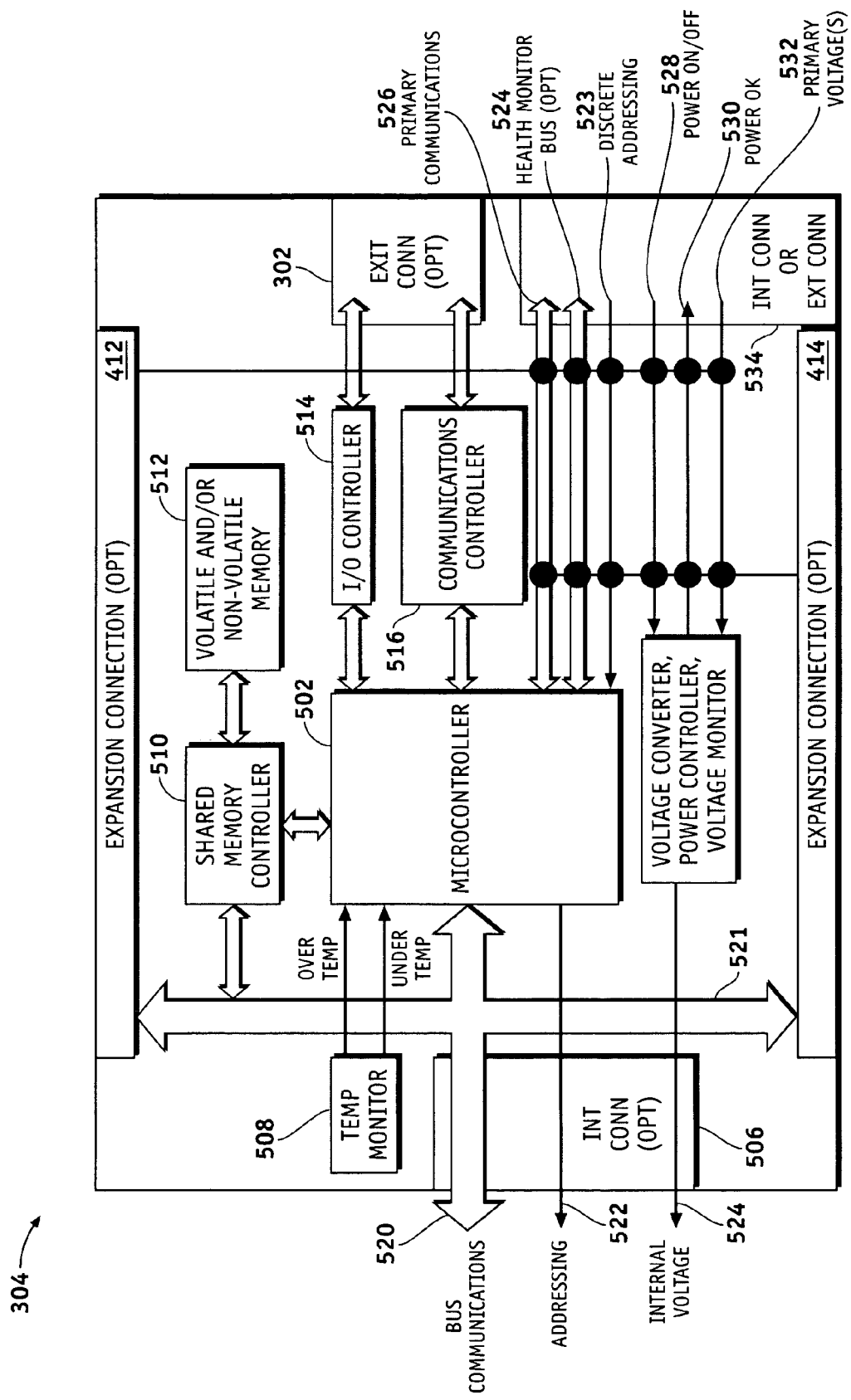
FIG. 5 is a functional block diagram of an adapter card in accordance with one embodiment of the present invention.

FIG. 5 shows a functional block diagram of an exemplary adapter card 304. In this embodiment, adapter card 304 generally includes a microcontroller (or other suitable processor) 502, a memory controller 510, memory 512, I/O controller 514, communications controller 516, external connector 302, internal connector 534, power module 514, temperature monitor 508, and optional internal connector 506.

Card 304 also includes one or more expansion connections 412 and 414. In the illustrated embodiment, card 304 includes two expansion connections: one along the topside of card 304 (412), and one along the bottomside of card 304 (414). As shown in the schematic block diagram, the expansion connections 412 and 414 communicate with each other electrically via a bus 521 and also share connectivity with primary communications bus 526, health monitor bus 524, discrete addressing 523, voltage converter block 504, and lines 528, 530, and 532.

Microcontroller 502 and memory 512 are preferably configured to perform status detection by determining whether another board is connected (e.g., a board assembly plugged into expansion connections 412 and 414), and then communicate with that board to determine whether that board is operating correctly (i.e., whether it is providing complete functionality). If one board assembly loses functionality, the other board assembly is configured to communicate through bus communications 520 and 521, as well as through any other communication channel, to provide the lost functionality.

The pair of boards may operate in single mode or dual mode. That is, each board assembly may operate independently or in a redundant mode as described above. In this regard, the redundant boards share information regarding, for example, bus communication, over/under temperature conditions, addressing, power on/off, Power OK, BIT/BITE modes, and the like. In one embodiment, memory mirroring is used to preserve and duplicate the memory on the other board assembly. In a further embodiment, the connected assemblies negotiate and operate in a master/slave mode.

Temperature controller 508 measures the temperature of board 304 and/or its environment using any convenient technique (e.g., a thermocouple, an on-board diode, etc.) and reports over-temperature and under-temperature conditions to microcontroller 502. Microcontroller 502 may then use this information for health reporting or the like.

I/O controller controls input and output between external connector 302 and microcontroller 502. Similarly, communications controller 516 controls wireless and/or wired communication from and to microcontroller 502. In this regard, external connector 302 is an optional component that may be used in applications where additional input and output to board 304 is required.

Power module 504 interfaces with an outside power supply and support electronics (not shown) through internal connector 534, receiving a primary voltage 532 and a power on/off state 528, and outputting a "power OK" status 530 as appropriate. In this regard, power module 504 preferably includes a voltage converter, a power controller, and a voltage monitor as known in the art. Power module 504 also supplies an internal voltage 524 through internal connector 506 to the 3U card (item 306 in FIG. 3).

Microcontroller 502 controls all the functions of adapter card 302 as outlined above. Furthermore, microcontroller 502 communicates with the outside world through internal connector 534 with respect to primary communications 526, health monitor bus 524, and discrete addressing 523. Microcontroller 502 preferably implements whatever protocols, signals, and addressing required by the standards to which it is conforming. In a cPCI 3U application, for example, Microcontroller 502 would use the various busses and discrete addressing lines to conform to the 3U specification while sending and receiving signals to the components resident on board 306.

The adapter card microcontroller 502 may utilize health monitor bus 524 to send a "health OK" message periodically to a cabinet health monitoring microcontroller. The cabinet health monitoring microcontroller then sends an acknowledgment of the received "health OK" message back to adapter card microcontroller 502. The health monitor also conveniently receives reset and shutdown commands from the cabinet health monitoring microcontroller.

Microcontroller 502 handles discrete addressing 522 and bus communications 520 to card 306 via internal connector 506. Memory controller 510 communicates with memory block 512 (e.g., a volatile or non-volatile memory component) as well as microcontroller 502 in order to control memory access. While the term "microcontroller" is used to refer to component (or components) 502, it should be understood this term is not meant as a limitation, and that any combination of hardware, software, and/or firmware may be employed for this purpose. The operation of conventional microcontrollers, memories, I/O controllers, and bus communications is known in the art, and therefore need not be described in further detail.

Adapter card 304 is reusable in that it may be coupled to one type of board initially, then disconnected from that board to be used in a subsequent application. Microcontroller 502 may implement software code that is specific to the first card, then reprogrammed to handle operation of a second card at a later date. Because adapter card 304 handles (via bus 520), all major communication to the backplane, to optional external I/O, etc., it may be programmed to work with a variety of components and systems.

As mentioned above, components (including software) that conform to a high level of certification may be isolated to one card (the "second card") corresponding to adapter card 304 while lower level components are included on another card (the "first card") corresponding to card 306. In this way, the most expensive and labor-intensive components are re-used for a variety of applications (including future cabinet designs) without requiring re-certification of that board. This lowers recurring costs, reduces development time, simplifies technology upgrades, and allows backward and forward compatibility with a variety of cabinet designs.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A redundant board assembly comprising:
a first board sub-assembly and a second board sub-assembly, said first and second board sub-assemblies each having a first functionality;
a module interconnect card configured to mechanically and electronically interconnect said first and second board sub-assemblies;

said first board sub-assembly configured to compensate for a loss of functionality when said second board sub-assembly exhibits a second functionality that is different from said first functionality;

said first board sub-assembly comprising:

a first card having a first end configured to interface with a backplane, and a second end; and a second card configured to removeably attach, mechanically and electrically, to said second end of said first card, said second card being configured to communicate with said first card and the backplane; and said second board sub-assembly comprising:

a third card having a third end configured to interface with the backplane, and a fourth end; and a fourth card configured to removeably attach, mechanically and electrically, to said fourth end of said third card, said fourth card being configured to communicate with said third card and the backplane.

2. The redundant board assembly of claim 1, said first and second board sub-assemblies conforming to 3U dimensions, and said redundant board assembly conforming to 6U dimensions.

3. The redundant board assembly of claim 1, said first card including a first set of components conforming to a first certification level, and said second card including a second set of components conforming to a second certification level.

4. The redundant board assembly of claim 3, said second certification level being higher than said first certification level.

5. The redundant board assembly of claim 4, said first certification level being a commercial off the-shelf (COTS) level.

6. The redundant board assembly of claim 1, said first board sub-assembly including an extender card.

7. The redundant board assembly of claim 1, said first card and said second card, when coupled, having a combined length of about 160 mm, and a combined height of about 100 mm.

8. The redundant board assembly of claim 1, said second board including an expansion connection.

9. The redundant board assembly of claim 1, said second board including a memory and a microcontroller, said microcontroller being configured to execute software resident within said memory in order to achieve said communication with said first card, said backplane, and said second sub-assembly.

10. The redundant board assembly of claim 1, wherein said communication with said first card and said backplane is accomplished via bus communications and discrete addressing.

11. The redundant board assembly of claim 1, said second board including a voltage converter, a power controller, and a voltage monitor.

12. The redundant board assembly of claim 9, said second board including a temperature monitor configured to communicate with said microcontroller.

13. The redundant board assembly of claim 9, further including a health monitor bus, said microcontroller being configured to provide health information via said health monitor bus.

14. A method of producing a first board sub-assembly, said method comprising the steps of:

providing a first card having a first and second end, said first end being configured to interface with a backplane; and providing a second card configured to removeably attach, mechanically and electrically, to said second end of said first card, said second card being configured to communicate with said first card and said backplane;

identifying a set of components to be attached to said board assembly;

isolating a first set of components that require conformance to a first certification level; said first certification level being a commercial off-the-shelf (COTS) certification level;

isolating a second set of components that require conformance to a second certification level; attaching said first set of components to said first card;

attaching said second set of components to said second card; and configuring said second card to communicate with a second board sub-assembly having a first functionality and to compensate for a loss of functionality when said second board sub-assembly exhibits a second functionality that is different than said first functionality.

15. The method of claim 14, said first card and said second card, when coupled, having a combined length of about 160 mm, and a combined height of about 100 mm.

16. The method of claim 14, further including connecting the first board sub-assembly with said second board sub-assembly.

17. The method of claim 14, wherein the first board sub-assembly as connected to said second board sub-assembly conforms to 6U dimensions.

18. A redundant board assembly comprising:

a first board sub-assembly and a second board sub-assembly, said first and second board sub-assemblies each having a first functionality;

a module interconnect card configured to mechanically and electronically interconnect said first and second board sub-assemblies;

said first board sub-assembly configured to compensate for a loss of functionality when said second board sub-assembly exhibits a second functionality that is different from said first functionality; and said first board sub-assembly further comprising:

a first card having a first end configured to interface with a backplane and a second end, wherein the first card includes a first set of components conforming to a first certification level; and a second card configured to removeably attach, mechanically and electrically, to said second send of said first card, said second card being configured to communicate with said first card and the backplane, wherein the second card includes a set of components conforming to a second certification level.

* * * * *

UNITED STATES PATENT AND TRADEMARK OFFICE
CERTIFICATE OF CORRECTION

PATENT NO. : 7,599,194 B2  
APPLICATION NO. : 11/317348  
DATED : October 6, 2009  
INVENTOR(S) : Gregory L. Sheffield It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 814 days.

Signed and Sealed this

Twenty-eighth Day of September, 2010

David J. Kappos  
*Director of the United States Patent and Trademark Office*